United States Patent
Shangguan et al.

(10) Patent No.: US 6,416,597 B1
(45) Date of Patent: Jul. 9, 2002

(54) SOLDER COMPOSITION AND A METHOD FOR MAKING THE SAME

(75) Inventors: Dongkai Shangguan; Robert J. Gordon, both of Livonia, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/642,176

(22) Filed: Aug. 18, 2000

(51) Int. Cl.[7] .................................................. B22F 1/02
(52) U.S. Cl. ........................ 148/513; 427/216; 427/217
(58) Field of Search ................... 428/570; 427/212, 427/216, 217; 148/513

(56) References Cited

U.S. PATENT DOCUMENTS

| | | | |
|---|---|---|---|
| 4,994,326 A | * 2/1991 | Shimmura et al. | 428/405 |
| 5,429,689 A | * 7/1995 | Shangguan et al. | 148/400 |
| 5,573,602 A | * 11/1996 | Banerji et al. | 148/24 |
| 5,817,194 A | * 10/1998 | Nagai et al. | 148/400 |
| 5,833,921 A | * 11/1998 | Paruchuri et al. | 420/589 |
| 5,871,690 A | * 2/1999 | Achari et al. | 420/559 |
| 5,928,404 A | * 7/1999 | Paruchuri et al. | 75/255 |
| 6,059,952 A | * 5/2000 | Kang et al. | 206/143 |
| 6,087,021 A | * 7/2000 | Gaynes et al. | 428/546 |
| 6,123,248 A | 9/2000 | Tadauchi et al. | |
| 6,159,304 A | * 12/2000 | Noguchi et al. | 148/23 |
| 6,186,390 B1 | * 2/2001 | Tadauchi et al. | 228/56.3 |

FOREIGN PATENT DOCUMENTS

| | | |
|---|---|---|
| EP | 0875331 A | 11/1998 |
| EP | 1038628 A | 9/2000 |
| JP | 9001382 | 6/1995 |
| JP | 2000158179 | 6/2000 |

\* cited by examiner

*Primary Examiner*—Daniel J. Jenkins
(74) *Attorney, Agent, or Firm*—Visteon Global Tech, Inc.

(57) ABSTRACT

A solder composition and a method 10 for producing such a solder composition is provide. The solder composition is substantially "lead-free", has a relatively long shelf life, and has a desirable melting temperature. Particularly, the solder composition contains tin and zinc with substantially all of the exposed zinc constituents or phases being covered by a relatively thin layer of tin. The formed solder composition may be operatively used with a mildly activated "no-clean" rosin flux.

14 Claims, 1 Drawing Sheet

SOLDER COMPOSITION AND A METHOD FOR MAKING THE SAME

FIELD OF THE INVENTION

The present invention generally relates to a solder composition and to a method for making a solder composition having a relatively long shelf life, a desired melting temperature, an d which uses en vironmentally desirable materials.

BACKGROUND OF THE INVENTION

Solder compositions are used to selectively attach electrical and electronic components (collectively referred to as "the components") to a circuit board or module. Typically, the solder composition is mixed with a flux and a carrier material to cooperatively form a solder paste. The solder paste is selectively deposited upon the solder pad portions of the various electronic circuits which are operatively contained upon and/or which are formed within these circuit boards or modules and the components are selectively and respectively placed upon these various solder deposits. The solder containing assemblies are then transported through an oven and are heated, effective to cause the flux to become activated and to remove oxide materials which may be present upon the pads and/or components. The solder material then melts, flows, and metallurgically interacts with the solder pads and the components. As the solder material cools, electrical interconnections are formed between the various components and the circuits, thereby allowing the various circuits and modules to perform their respectively desired functions.

Many of the prior solder compositions include material, such as lead, which is environmentally undesirable. While some attempts have been made to provide solder compositions without the use of lead, these solder compositions have a relatively high melting temperature, therefore requiring a soldering temperature which cause undesirable damage or destruction to the components and/or to the circuit board and module, or have a melting temperature that is undesirably low and which causes the solder, of a formed joint, to "creep" and/or "crack" during normal operation. Further, these compositions have a relatively short "shelf life" (i.e., they require use shortly after being created), thereby complicating the soldering process, undesirably increasing the overall soldering cost, and restricting their respective use in large volume production type operations. Further, these prior "non-leaded" soldering compositions do not generally provide robust joints without the use of flux material which undesirably requires the use of known ozone depleting cleaning agents to clean the module after soldering in order to substantially prevent the formation of flux residues which undesirably cause malfunction of the circuit board or module.

There is therefore a need for a "non-leaded" or "environmentally friendly" solder composition which overcomes at least some of the previously delineated drawbacks of prior non-leaded solder compositions and which, by way of example and without limitation, allows for the selective formation of generally reliable joints and which has a melting temperature which is substantially similar to the melting temperature of many "lead based" solder compositions which are already in use in current production, such that minimal changes will be required to utilize this new and useful solder composition in these operations (i.e., the new and improved solder composition may function as a "drop in" replacement for currently used lead based solder compositions).

SUMMARY OF THE INVENTION

It is a first object of the present invention to provide a solder composition and a method for making such a solder composition which overcomes many of the drawbacks of prior solder compositions.

It is a second object of the present invention to provide a solder composition and a method for making such a solder composition which overcomes many of the drawbacks of prior solder compositions and which is comprised of tin and zinc, thereby obviating the need for lead material.

It is a third object of the present invention to provide a non-leaded solder composition which has a melting temperature which is substantially similar to the melting temperature of many lead based solder compositions which are currently used in large volume production.

It is a fourth object of the present invention to provide a non-leaded solder composition which has a relatively long shelf life and which has a melting temperature which is substantially similar to prior lead based solder compositions.

According to a first aspect of the present invention, a solder composition is provided. The solder composition includes an alloy of tin and zinc wherein at least a portion of the zinc is coated with tin.

According to a second aspect of the present invention, a method for creating a solder composition is provided. The method comprises the steps of forming a first material; then forming a thin layer of tin upon at least a portion of the first material.

These and other features, aspects, and advantages of the present invention will become apparent from a reading of the following detailed description of the preferred embodiment of the invention and by reference to the following drawings.

DETAILED DESCRIPTION OF THE PREFERRED EMBODIMENT OF THE INVENTION

Figure 1:
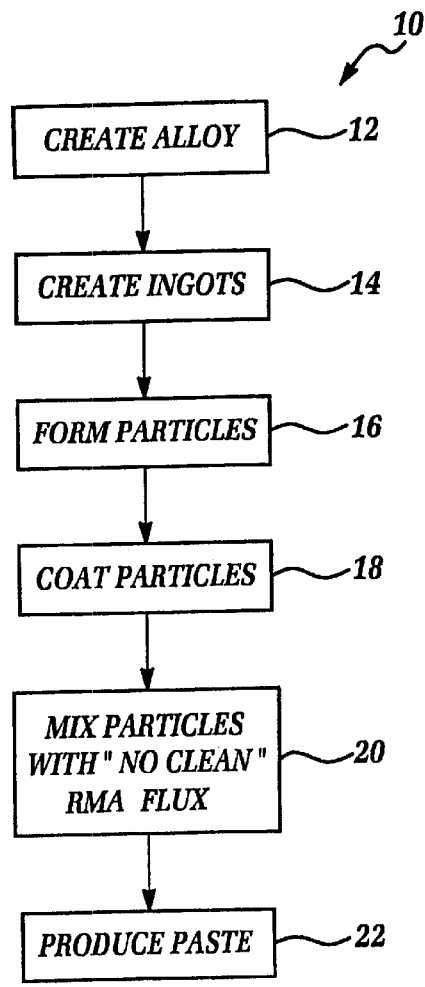
FIG. 1 is a flowchart illustrating the sequence of steps which cooperatively comprise the methodology of the preferred embodiment of the invention.

Referring now to FIG. 1, there is shown a flowchart or methodology 10 which comprises the sequence of steps of the methodology of the preferred embodiment of the invention. Particularly, methodology 10 includes a first step 12 in which a certain alloy comprising a desired combination of tin and zinc is created. In one non-limiting embodiment of the invention, the alloy comprises a eutectic composition and contains about ninety to about ninety-two weight percent of zinc. In a further non-limiting embodiment of the invention, the alloy is comprised of about 91.2 weight percent of tin and about 8.8 weight percent of zinc. Moreover, in this further non-limiting embodiment, the formed alloy includes the following properties:

Eutectic Temperature: 198.5 C

Density: 7.28 (g/cm$^3$)

Hardness: 21.3 HV

Tensile Stress: 45.5 Mpa

Shear Stress: 48.8 Mpa

Elongation: 40%
Coefficient of Thermal Expansion: $22.8 \times 10^{-6}$/K
Electrical Resistivity: 13.5 micro-Ohm cm
Young's Modulus: 53 Gpa The alloy may be formed by placing the required amount of zinc and tin within a crucible, melting the material, and then agitating the crucible until the materials have been thoroughly mixed to, for example and without limitation, achieve the previously delineated properties.

Step 12 is followed by step 14 in which ingots are created by use of the created alloy. In the preferred embodiment of the invention, the ingots are created in a substantially inert atmosphere or in a vacuum type atmosphere, and such ingots are created by placing the molten alloy material into ingot containers or molds and allowing the material to solidify, thereby causing the material to form the desired ingots. The formed ingots are then removed from the containers or molds.

Step 16 follows step 14 and, in this step, the ingots are used to form particles by melting and atomizing the ingots in a substantially inert or vacuum type atmosphere. Such atomization may be achieved by conventional techniques and produces particles having zinc and tin phases or constituents and wherein some of the zinc phases or constituents have exposed surfaces. Step 18 follows step 16 and, in this step, substantially all of the exposed surfaces of substantially all of the zinc phases or constituents are "coated" with a substantially thin later of tin. In one non-limiting embodiment, the particles are selectively immersed into a bath containing a 127.5 gram per liter solution of stannous chloride (SnCl) at room temperature. In this manner, at least one zinc atom appearing on the surface of each particle is replaced with at least one tin atom from the bath. As used in this Application, the term "thin" denotes a thickness of about four to about 1000 atoms of tin. In the most preferred embodiment, all of the zinc atoms appearing on the surface of each solder particle are replaced with at least one tin atom.

Step 20 follows step 18 and, in this step, the coated particles are mixed with a relatively mild and "no-clean" type of flux, such as a mildly activated rosin, and packages in step 22, thereby producing a solder paste which may selectively be used to secure components upon a circuit board and/or module.

Figure 2:
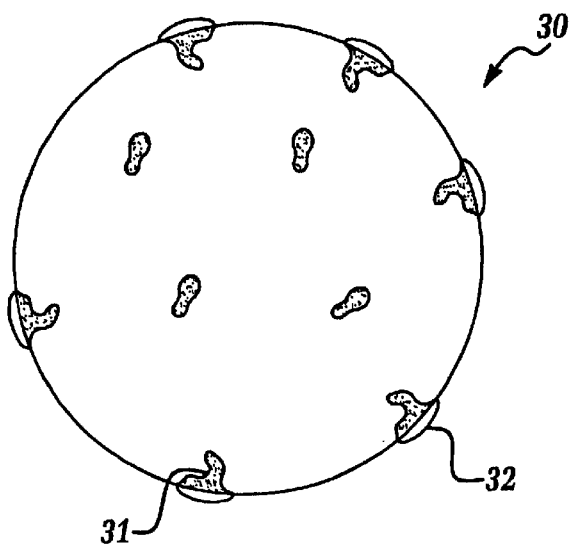
FIG. 2 is a cross section of a particle formed in accordance with the teaching of the methodology of the preferred embodiment of the invention.

A cross section of one of the particles 30 is shown in FIG. 2. Particularly, particle 30 includes several exposed phases or constituents 31 of zinc material which are substantially covered with a substantially thin layer of tin 32. The thin layer of tin 32 cooperatively and substantially prevents the exposed zinc constituents or portions 31 from reacting with atmospheric constituents, thereby desirably increasing the shelf or storage life of the produced solder material. Further, the foregoing material is substantially "lead free" and has a melting temperature of about 198.5 Centigrade which is substantially identical to many lead-based solder materials. Moreover, the formed composition is cost effective and allows for the use of a "no-clean" flux since the formed composition does not substantially react with the flux due to the presence of the tin coating upon substantially each of the previously and respectively exposed surfaces of each of the zinc constituents or phases.

It is to be understood that the invention is not limited to the exact construction and method which have been previously delineated, but that various departing from the spirit and the scope of the invention as set forth in the following claims.

What is claimed is:

1. A method for creating a solder composition comprising the steps of:
   providing zinc;
   providing tin;
   forming an alloy by placing said provided zinc and said provided tin within a crucible, melting the zinc and tin, and mixing the zinc and tin;
   creating an ingot by use of said formed alloy; and
   melting and atomizing said ingot, thereby creating a plurality of particles, each of said plurality of particles having a respective surface having a zinc portion and a tin portion;
   covering only said zinc portion of each of said surfaces of the plurality of particles with a thin layer of tin by preparing a bath containing. stannous chloride; and placing each of said plurality of particles within said bath of stannous chloride.

2. The method of claim 1 wherein said bath of stannous chloride contains about 127.5 grams per liter of stannous chloride.

3. The method of claim 2 further comprising the step of mixing said plurality of particles with a mildly activated rosin.

4. The method of claim 3 wherein said step of melting and atomizing said ingot is accomplished in an inert atmosphere.

5. The method of claim 3 wherein said step of melting and atomizing said ingot is accomplished in a vacuum type atmosphere.

6. The method of claim 1 wherein said formed alloy contains about ninety to about ninety two percent by weight of zinc.

7. The method of claim 1 wherein said formed alloy contains about 91.2 percent by weight of tin.

8. A method for creating a solder composition comprising the steps of:
   providing zinc;
   providing tin;
   forming an alloy by placing said provided zinc and said provided tin within a crucible, melting the zinc and tin, and mixing the zinc and tin;
   creating an ingot by use of said formed alloy;
   melting and atomizing said ingot, thereby creating a plurality of particles, each of said plurality of particles having a respective surface having exposed zinc atoms; and
   replacing each of said exposed zinc atoms of each of said plurality of particles with tin atoms.

9. The method of claim 8 wherein said step of replacing said exposed zinc atoms with tin atoms comprises the steps of preparing a bath containing stannous chloride; and placing each of said plurality of particles within said bath of stannous chloride.

10. The method of claim 9 further comprising the step of mixing said plurality of particles with a mildly activated rosin.

11. The method of claim 8 wherein said step of melting and atomizing said ingot is accomplished in an inert atmosphere.

12. The method of claim 8 wherein said step of melting and atomizing said ingot is accomplished in a vacuum type atmosphere.

13. The method of claim 8 wherein said formed alloy containing about ninety to about ninety two percent by weight of zinc.

14. The method of claim 8 wherein said formed alloy contains about 91.2 percent by weight of tin.

* * * * *